(12) United States Patent
Taranta et al.

(10) Patent No.: US 9,934,094 B2
(45) Date of Patent: Apr. 3, 2018

(54) PROCESS FOR VERIFICATION OF RANDOMLY GENERATED I/O REQUESTS

(71) Applicant: Seagate Technology LLC, Cupertino, CA (US)

(72) Inventors: Eugene Taranta, Casselberry, FL (US); Lyle Conn, Lake Mary, FL (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 166 days.

(21) Appl. No.: 14/928,683

(22) Filed: Oct. 30, 2015

(65) Prior Publication Data

US 2017/0123913 A1    May 4, 2017

(51) Int. Cl.
    *G06F 11/10* (2006.01)
    *G06F 11/22* (2006.01)

(52) U.S. Cl.
    CPC ...... *G06F 11/1088* (2013.01); *G06F 11/1096* (2013.01); *G06F 11/2289* (2013.01)

(58) Field of Classification Search
    CPC ............. G06F 11/1088; G06F 11/2289; G06F 11/1096
    See application file for complete search history.

(56) References Cited

U.S. PATENT DOCUMENTS

| 5,138,619 | A  | * | 8/1992  | Fasang ................. G11C 29/20 714/718 |
| 7,469,253 | B2 |   | 12/2008 | Celis et al. |
| 8,504,847 | B2 |   | 8/2013  | Resch et al. |
| 8,694,700 | B1 |   | 4/2014  | Natonzon et al. |
| 8,874,602 | B2 |   | 10/2014 | Harada et al. |
| 9,148,197 | B1 | * | 9/2015  | Hartman ............... H04B 1/7143 |
| 2006/0168483 | A1 | * | 7/2006 | Sherlock .......... G01R 31/31858 714/43 |
| 2011/0134930 | A1 | * | 6/2011 | McLaren .............. H04L 1/1614 370/401 |
| 2012/0005455 | A1 | * | 1/2012 | Ueda ....................... G06F 7/584 711/217 |
| 2012/0215961 | A1 | * | 8/2012 | Strasser ................. G06F 1/183 711/102 |
| 2014/0205093 | A1 | * | 7/2014 | Cho .................. G11B 20/00086 380/46 |
| 2016/0210226 | A1 | * | 7/2016 | Hall ..................... G06F 11/3672 |

OTHER PUBLICATIONS

"Error detecting refreshment for embedded DRAMs" IEEE Conferences | Jan. 1, 1999 | Proceedings 17th IEEE VLSI Test Symposium (Cat. No. PR00146) (pp. 384-390).*

* cited by examiner

*Primary Examiner* — Cynthia Britt
(74) *Attorney, Agent, or Firm* — Hollingsworth Davis, LLC

(57) ABSTRACT

A sequence number is assigned to a data storage operation targeted for a persistent data storage device. The sequence number is used to seed a random number generator. A random sequence is obtained from the random number generator, each element of the random sequence being used to generate characteristics of the operation. The data storage operation is fulfilled in accordance with the characteristics, the characteristics being subsequently determinable using the sequence number.

20 Claims, 8 Drawing Sheets

US 9,934,094 B2

PROCESS FOR VERIFICATION OF RANDOMLY GENERATED I/O REQUESTS

SUMMARY

Various embodiments described herein are generally directed to randomly generated data access requests. In one embodiment, a sequence number is assigned to a data storage operation targeted for a persistent data storage device. The sequence number is used to seed a random number generator. A random sequence is obtained from the random number generator, each element of the random sequence being used to generate characteristics of the operation. The data storage operation is fulfilled in accordance with the characteristics, the characteristics being subsequently determinable using the sequence number.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

General-purpose computing devices often include some sort of persistent data storage. While some types of devices, e.g., thin clients, may make use of minimal or no rewritable storage, more often devices include some manner of persistent storage (e.g., hard disk drive, flash memory) to save machine state data and user data so that the data will be available after the machine is powered off. While some devices such as mobile devices may include some amount of persistent storage, these and other devices are increasingly using network-accessible storage, sometimes referred to as "cloud storage."

Cloud storage systems may be located in large data centers which utilize large numbers of networked computing nodes and data storage racks. These nodes may be made available to the public for purposes such as web hosting or cloud storage, and/or may be restricted to access by an organization (e.g., company, government entity). In some applications (e.g., financial transactions), data integrity is given high priority. Because data is stored and transferred via physical devices, the data is susceptible to corruption due to random noise, device failure, software errors, etc. Most devices include facilities to detect data corruption and correct it. For example, both persistent storage devices and network communications may utilize additional data (e.g., error correction codes) that facilitates detecting and correcting data corruption.

The present disclosure relates to application-level tools for testing storage systems. In the present disclosure, a computing system includes a testing module component that provides data integrity testing. For example, when an engineer modifies storage software such as drive firmware, RAID algorithms, caching/queuing algorithms, etc., then the modifications need to be tested to verify that the changes do not introduce data corruption or other problems. While tools exist for testing performance and data integrity of files or block devices, such tools cannot generate truly random input/output (I/O) from any statistical distribution over an unbounded address space.

Figure 1:
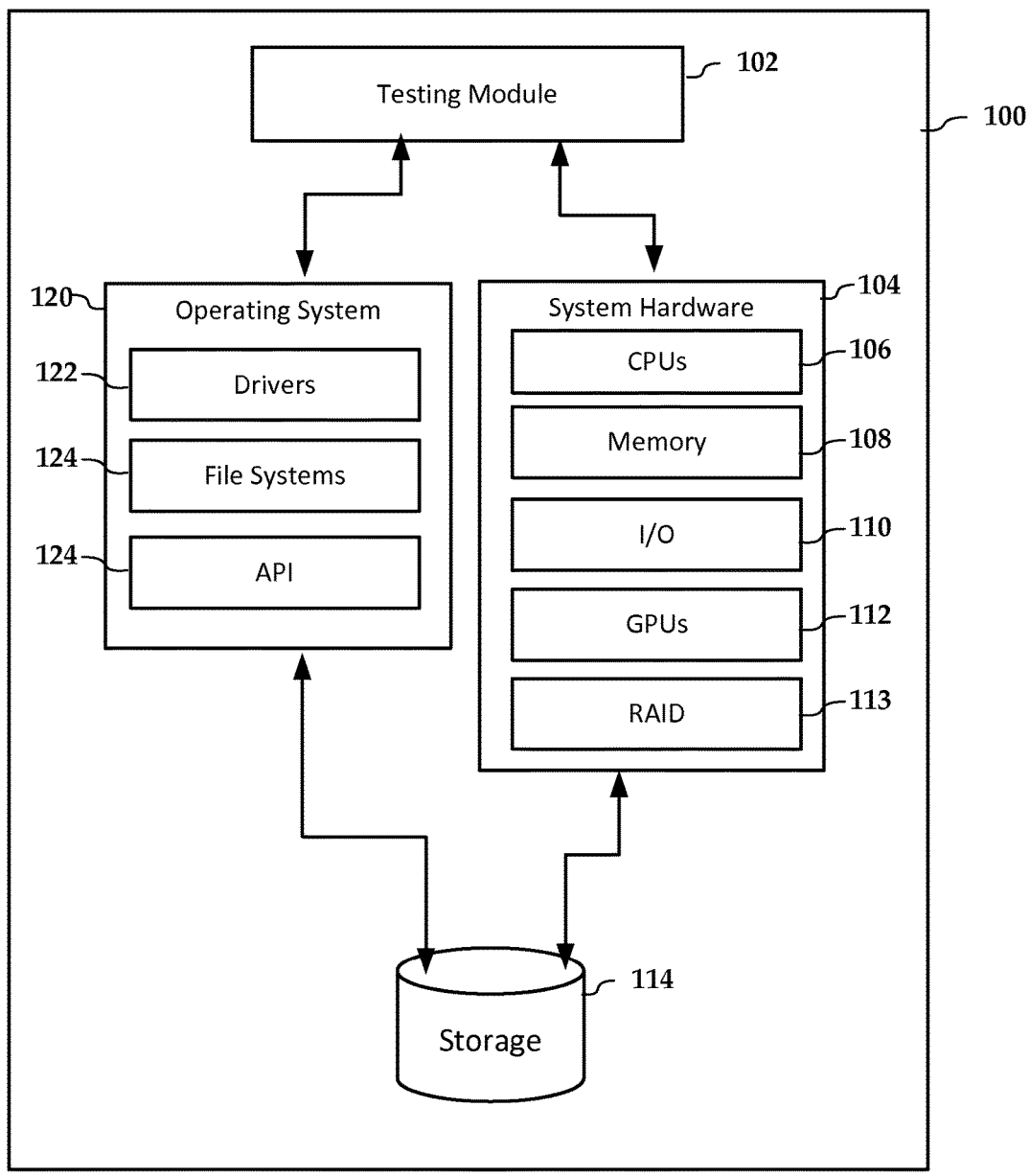
FIG. 1 is a block diagram of an apparatus according to an example embodiment.

In FIG. 1, a perspective view that illustrates components of a computing apparatus 100 that utilizes a testing component 102 according to an example embodiment. The apparatus includes system hardware 104 such as one or more central processing units 106, memory 108 (e.g., dynamic random-access memory), I/O circuitry 110 (e.g., PCI busses, network cards, peripheral interfaces) and one or more graphics processing units 112. Also shown is one or more persistent data storage devices 114, which may be considered part of the system hardware 104. The data storage devices 114 may include any type of storage technology, include hard disk drives (HDDs), flash memory, optical storage, magnetic tape, etc.

The system hardware 104 may include storage-specific hardware as indicated by RAID controller 113. Generally, the RAID (which stands for redundant array of independent disks) controller 113 creates virtual storage volumes using two or more hardware storage devices (e.g., disk drives, solid state drives, etc.). The virtual volumes are presented to an operating system 120 as a single storage device, which allows the operating system 120 to utilize legacy storage and file management software to access the virtual drive. The RAID controller 113 performs tasks such as distributing data to the different storage devices, verifying data integrity, calculating and storing error correction data, etc. The RAID controller 113 may also be considered part of the data storage devices 114.

The operating system (OS) 120 runs on the system hardware 104 and interfaces with the hardware via drivers 122. For accessing the data storage devices 114, the operating system may maintain one or more filesystems 124. Generally, a filesystem (e.g., NTFS, FAT, ext-n, btrfs, NFS, etc.) is a way of organizing data stored on the storage devices 114 so that it is easily identified and accessed. Generally, a file system maps logical structures such as files and folders to block addresses of the data storage devices 114. These logical structures are presented to the user via an application program interface (API) 124 of the operating system 120. For example, a command line terminal may accept user commands that allow, via the API 124, navigating through the file system and accessing the files (e.g., reading from and writing to the files). The file system may be used to access a local storage device 114 as shown, and/or be used to access a remotely coupled device, e.g., via a network file system.

In one example, a testing program may conduct a test sequence that involves writing to a range of logical block addresses (LBAs). In such a case, the program may maintain a per-LBA structure having a 1:1 correspondence with the LBA address range of the storage device 114. This structure can be managed so that metadata containing information about the content at an LBA resides within the structure. Upon reading previously written data from a storage device, the structure is utilized to determine what valid data should have been read. These structures may be maintained in dynamic random access memory (DRAM) for performance reasons. However, such structures may use a significant amount of memory (a large portion of memory is already reserved just to buffer read and write I/O), which can result in storage of the structures on the hard disk via a virtual memory management. Accessing virtual memory can significantly impact performance.

As a variant of the above strategy, the testing program can keep a cache of previously written sectors and utilize a replacement strategy (e.g., least recently used) similar to a read or write cache. This limits memory consumption but sacrifices accuracy as valid entries are replaced by new entries and so the replaced entries can no longer be verified. Further, given a sufficiently large range and random I/O pattern, very few accesses will result in cache hits. In other configurations, a bijective function can be used that maps enumerated write I/O requests into the LBA space and its inverse function maps from the LBA space back into the enumerated I/O request space. When data is read from disk, the inverse function is used to determine which previous I/O wrote to the associated LBAs. This approach can quickly become complicated and does not support overlapping I/O.

The illustrated testing module 102 uses an alternate approach that leverages computational power such as that provided by GPU 112 and/or analogous co-processors. The task of the testing module 102 in verifying a read request may be summarized as follows: given a contiguous set of LBA addresses and the I/O request history of a storage device, for each LBA accessed by the read request, determine the greatest enumerated I/O request that previously wrote to the block. Once this is found, then data associated with each previous write request is used to verify the data that is read back from the storage device.

Here it is assumed that the enumerated I/O request number (perhaps in combination with the LBA itself) is used to determine what data is written to a storage device. Generally, I/O generation utilities designed to test data integrity may be limited in range and may be unable to provide coverage over large capacities without sacrificing either performance, capability, or accuracy. The proposed solution is able to cover an unlimited address range without such sacrifices. Further, this approach is memory efficient as it does not require an auxiliary structure to store mapping data.

This approach does not keep a history of data previously written to media, which is the approach used by many data integrity tools to verify data correctness of reads. Instead the testing module 102 generates the expected data in situ via GPU 112 as required. With recent advances in general-purpose computing on GPU (GPGPU) and other multicore technologies, it is now possible to solve general problems that are highly parallel in an efficient manner. One such problem is to determine the last I/O that wrote to a specified LBA given a history of write I/O requests. In the context of validation testing, this can be used to perform a large number of randomly distributed writes (presumably some overlapping), and verify the written data using randomly distributed reads over the same address space.

Figure 2:
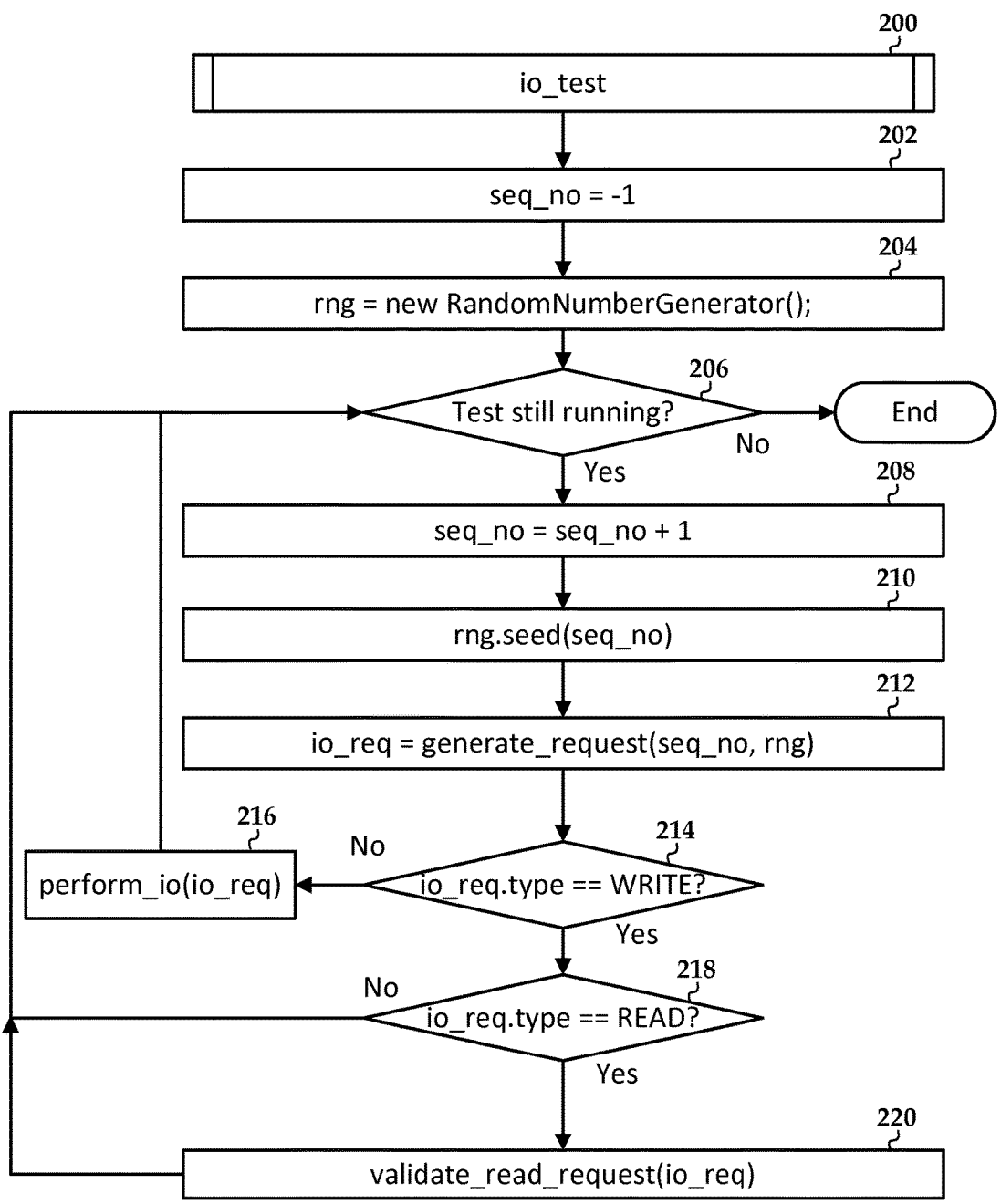
FIGS. 2-5 are flowcharts illustrating a test procedure according to an example embodiment.
Figure 3:
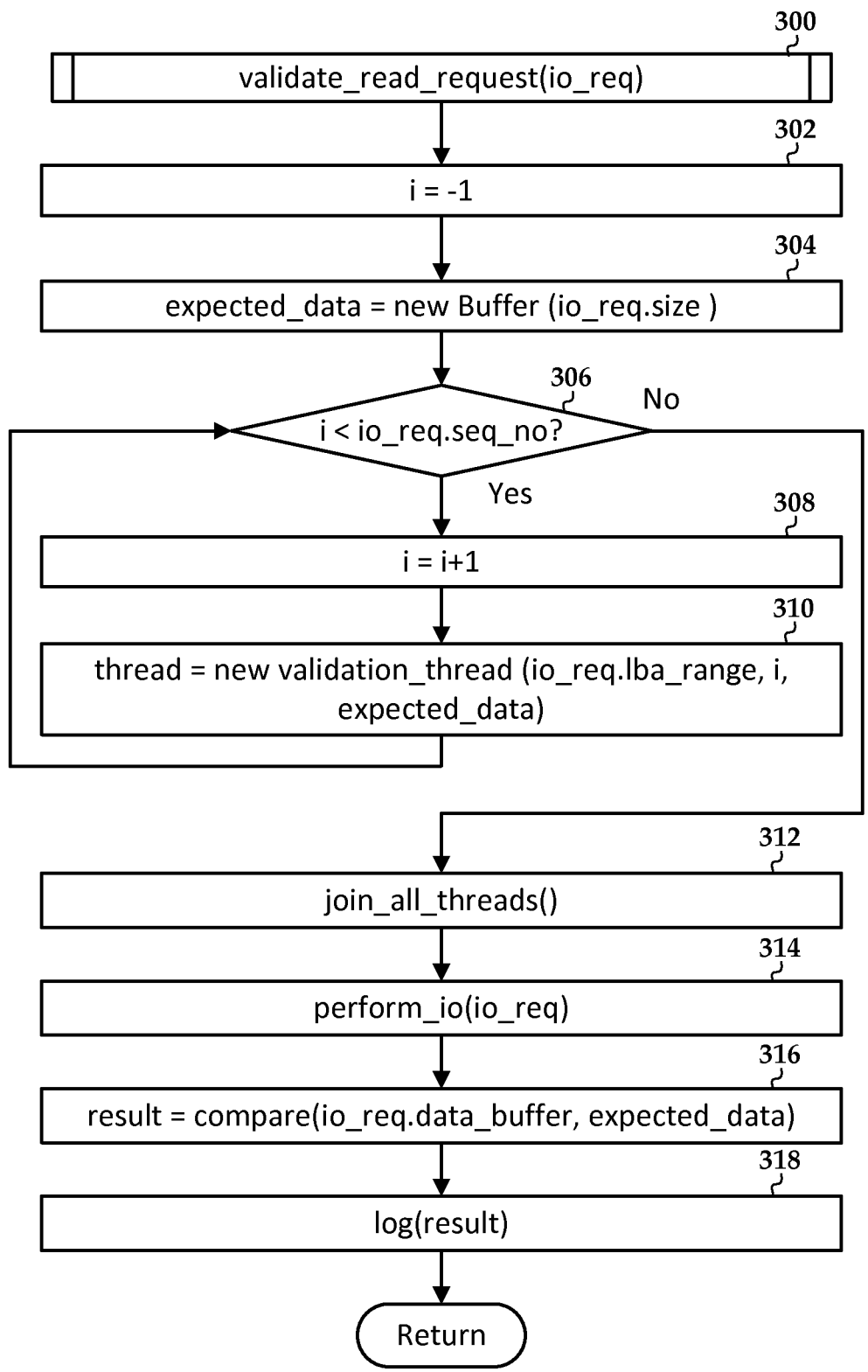
Figure 4:
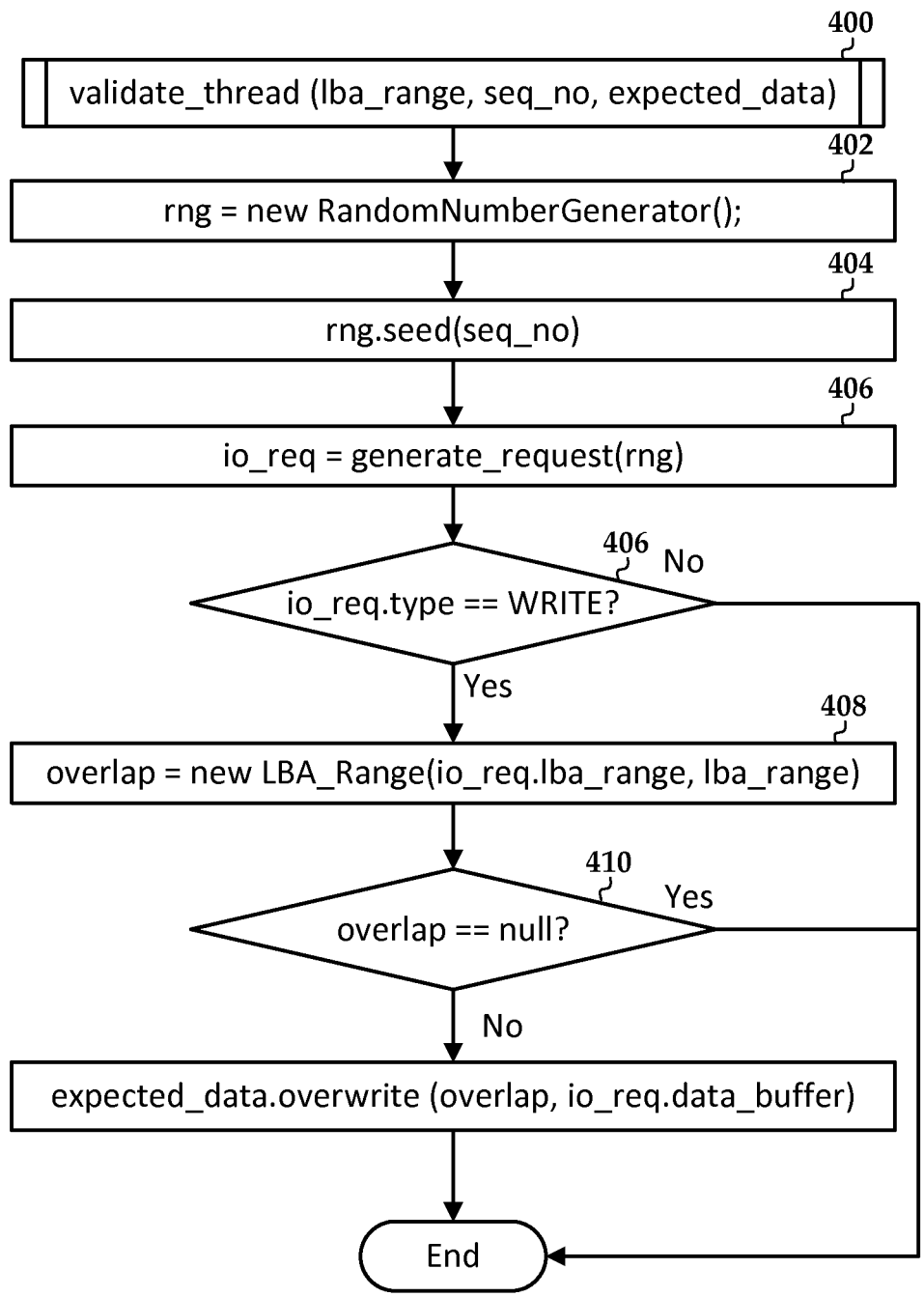

In FIGS. 2-4, flowcharts outline an I/O test procedure 200 according to an example embodiment. The flowchart in FIG. 2 shows an outer loop of the test procedure 200. A sequence number is first initialized 202. In this case, the sequence numbers will start at −1 and continue to be incremented for each I/O request. A random number generator (RNG) is also instantiated 204. This RNG is used to populate each newly generated I/O request in the outer loop, which begins at conditional block 206. The conditional block 206 may return "no" based on any number of factors, such as elapsed time, number of I/O operations, sequence number exceeding a limit (e.g., MAX_INT), threshold number of errors detected, system interrupt, etc.

During each execution of the loop, the sequence number is incremented and used to seed 210 the RNG. Generally, an RNG will produce a random or pseudo-random sequence based on a seed value. Each number in the sequence is within a known range (e.g., 0.0 to 1.0, 0 to MAX_UNSIGNED_LONG) and with a uniform distribution, e.g., each possible number in the range has an equal probability of occurring. While each number in the sequence is random relative to others of the sequence, the entire sequence can be reproduced exactly by seeding an equivalent RNG with the same seed.

Figure 5:
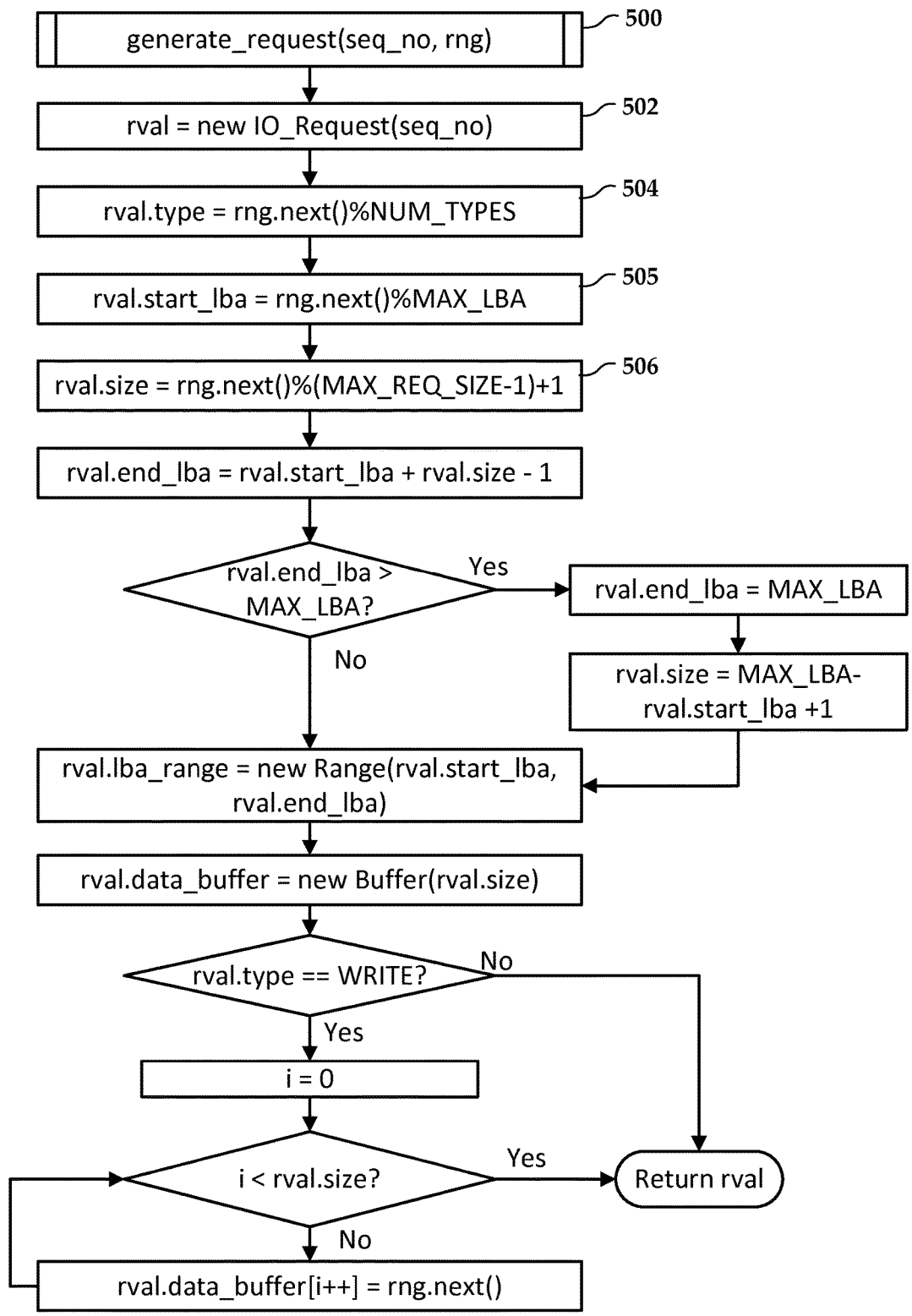

The RNG is used to generate 212 a request, the characteristics of the request being defined by using the uniquely seeded RNG for that I/O. An example of a function used to generate 212 the request is shown in FIG. 5 and will be discussed in greater detail below. Generally, this function uses the RNG to populate a request structure with random attributes such as type (READ, WRITE), LBA range, etc. Each attribute is generated based on a number retrieved from the random sequence produced by the RNG, the numbers and attributes assigned to each other in a predetermined order. To ensure that different executions have different random sequence I/O, the seeds may include sequence numbers summed with a constant value specific to the test run, such as the system time when the test started. This ensures different test runs have different random sequences, yet by logging the start time with the test results the test can be exactly recreated, e.g., for troubleshooting errors.

At conditional block 214, if it is determined that the request is a write request, the write is performed 216 and the loop begins again. If instead it is determined that the request is a read at conditional block 218, then the read request is validated, e.g., using example procedures shown in FIGS. 3 and 4, after which the outer loop starts again. It should be noted that if there are only read and write requests generated, then the conditional block 218 is not needed. If other types of requests are handled (e.g., verify) then the "no" result of block 218 may instead be directed to another handling routine before starting the outer loop again.

The flowchart in FIG. 3 shows an example function 300 that can be used to validate a read request. The function 300 takes a current read request as a function parameter. A local counting variable is initialized 302 to zero and a buffer is instantiated 304 to store the validation data. The instantiation 304 may include initializing the data of the buffer (e.g., set to all zeros) and initializing other data structures described below. Conditional block 306 is a loop that iterates through every prior request that occurred before the current read request, starting with the oldest. The loop 306 may iterate the other way, e.g., starting with the newest request, e.g., io_req.seq_no −1, in which case the loop can exit once each element in the expected_data buffer has been filled in. The local variable used to track sequence number is incremented 308 and used to generate a thread of execution to determine whether a prior write request affected an LBA range of the current read request.

Generally, a thread of execution (also referred to as a lightweight process) allows a process to spawn an independently executable set of instructions that can be run in parallel with the main process and with other threads. The thread of execution at block 310 is provided for purposes of explanation and not of limitation. As noted above, the executed code may be executed on a GPU, which may use alternate means of achieving parallel execution. An example of the instructions executed by each thread is shown in the flowchart of FIG. 4. Generally, each thread reconstructs the request, and if the request was a write in the LBA range of the current request (io_req), then the written data is added to the expected data buffer. After the loop 306 has terminated, then all the previous requests have spawned threads, and block 312 is a wait state to ensure all threads have completed. After block 312 is complete, the expected data buffer will be populated with previously written data from write requests that affected the LBA range. The read request is then executed 314 to read the LBA range from the disk. The data buffer of the executed request is then compared 316 to the expected data, and the results 318 are logged. The results may include at least an indication of pass/fail as well as affected LBAs. Further, the history of the write requests that filled the expected data buffer can be stored for reconstruction, e.g., re-running the test and validating each write request separately.

The flowchart of FIG. 4 shows an example of code that can be executed in parallel, e.g., by a separate GPU core. An RNG is instantiated 402 and seeded 404 with the sequence number. For purposes of brevity, an I/O request is shown being generated 406 using the function shown in FIG. 5. However, it is not necessary to recreate the whole request, as most of the requests will be either of the wrong type (as detected at block 406) or not affect the current LBA range, as shown by blocks 408 and 410. The constructor for the LBA range object in block 408 takes two ranges as input and returns either null if there is no overlap, or a range object if there is an overlap. The range object would at least have a start LBA and an end LBA as member. If there is overlap, then the affected LBAs and the data buffer of the write request is used to overwrite the appropriate sections of the expected data buffer.

The expected data buffer is a global variable in this example, meaning it is visible to all the threads. Generally, the threads will use some sort of synchronization mechanism (e.g., locks) to ensure the buffer is only being updated by one thread at a time. The expected data buffer may also include additional data, such as for each LBA, the sequence number of the last write operation that changed the LBA. In this way, if the threads get executed out of order, this can prevent overwriting a newer write request with an older request that affected an LBA.

Instead of considering the expected data, we can use the sequence IDs for each LBA. As noted before, the expected data buffer was initialized to some value (e.g., −1s) before being populated. If there are any −1 elements remaining after all the threads have been completed, this indicates that there were no writes to the LBA associated with the data block. An alternate approach is to use a data structure (e.g., a series of bitmasks) to indicate whether blocks were ever written. This information may be needed when validating a read request (block 316 in FIG. 3), because if a block of data on the disk was never written to, there may be no guarantee what data will be read back. As such, a mis-compare of such blocks should not be treated as a failure.

In FIG. 5, a flowchart illustrates an example 500 of the previously mention request generation function, with a sequence number and previously seeded RNG (see block 212 in FIG. 2) as inputs. An I/O request data structure is instantiated 502 using the sequence number, which is stored as a member data variable. Respective type, start LBA, and size variables are generated at blocks 504-506. In this example, the RNG returns an unsigned integer from 0 to MAX_INT. Generally, the outputs of the RNG can be scaled to a desired numeric range, e.g. by using the modulus operator in this example. At block 506, an addition is also used to prevent zero size requests, and this may be used for other variables (e.g., start LBA values).

In this example, randomized characteristics of the new I/O request are based on samples drawn from the uniform distribution provided by the RNG. When required, the random sample can be transformed into a desired distribution using the target distribution's cumulative distribution function. For instance, random numbers from 0 to 1 can be converted into a normal bell shaped curve with desired mean and variance. These parameters can be stored as a configuration of the testing module, and used appropriately in a request generation function.

Figure 6:
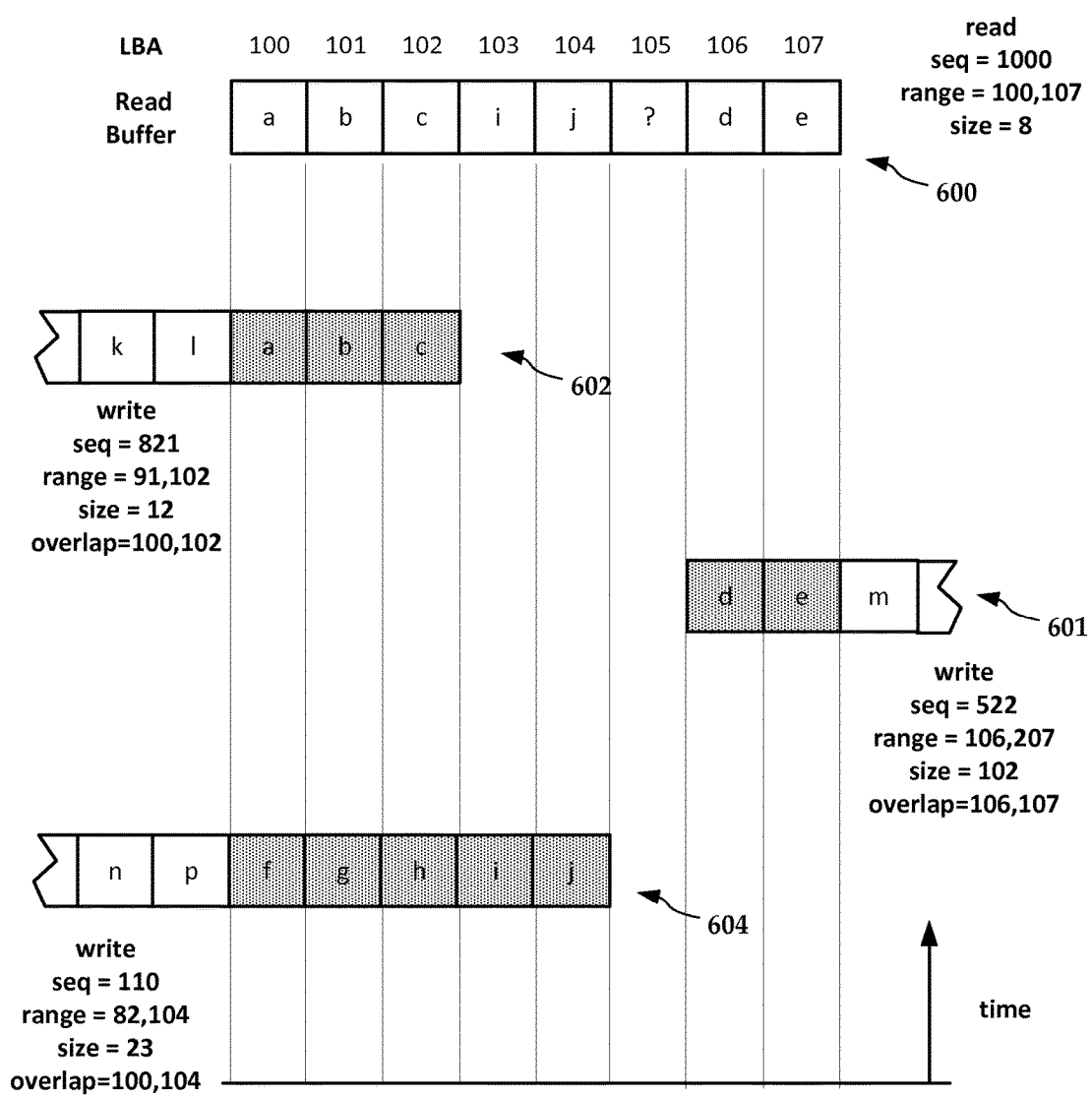
FIG. 6 is a block diagram showing overlapping writes to an address range according to an example embodiment.

In FIG. 6, a block diagram illustrates how overlapping write requests affect an LBA block and also illustrate reconstruction of the expected data according to an example embodiment. Blocks 600 represent an expected and actual data of a read request. As such, these blocks 600 may represent both the blocks of data stored on the disk and/or a read buffer used to reconstruct the data. The read request has a sequence number of 1000, and covers LBAs from 100-107. In order to validate data read back from a storage device (e.g., disk drive, RAID array) at these addresses, requests 0-999 are regenerated at least in part to determine if any of the requests were write requests that had an LBA range overlapping the indicated 101-107 range.

In this example, three write requests 602-604 overlap the read request range, being arranged from bottom to top in order from oldest to newest as indicated by the respective sequence numbers of the write requests. The write requests 602-604 and associated data were randomly generated as previously described, e.g., in the flowchart of FIG. 5. Note that LBAs 100-102 in the read buffer include data from write operation 602 that partially overwrote data from write operation 604. Also note that no operations wrote to LBA 105, and so the data stored at this LBA is indeterminate in cases where all the blocks were not initialized. It will be understood that other write ranges may be considered overlapping that are different than illustrated, e.g., larger than the indicated range (e.g., LBA 90-200), coincident with the range (e.g., LBA 100-107), and within the range (e.g., LBA 101-104). It will be understood that a read buffer for the reconstructed data may take other forms (e.g., including all the written data, and not just the latest), and this example is not intended to be limiting.

Figure 7:
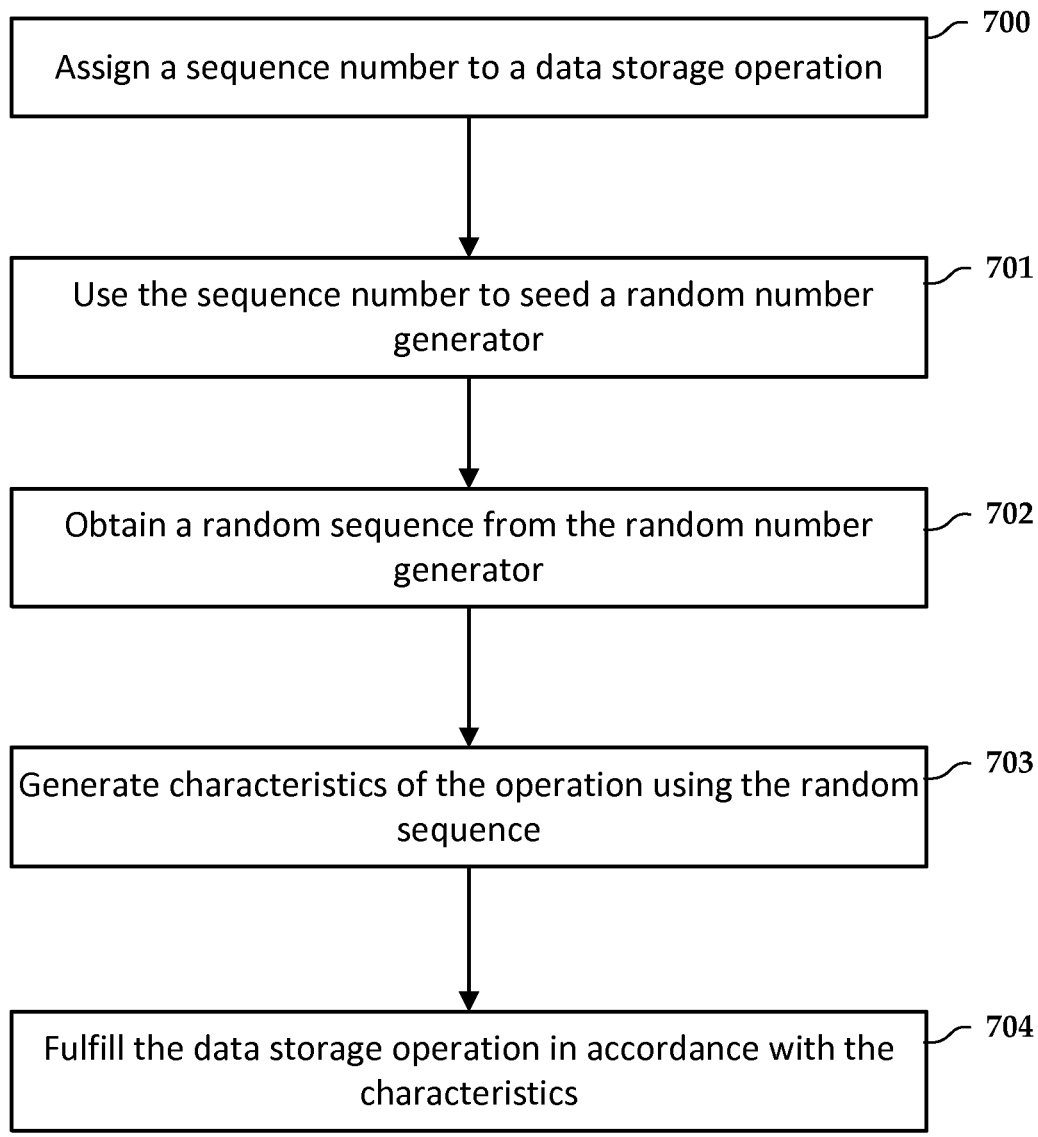
FIGS. 7-8 are flowcharts showing methods according to example embodiments.

In FIG. 7, a flowchart illustrates a method according to an example embodiment. The method involves assigning 700 a sequence number to a data storage operation targeted for a persistent data storage device. The sequence number is used to seed 702 a random number generator. A random sequence is obtained from the random number generator. Each element of the random sequence is used to generate 703 characteristics of the operation. The data storage operation is fulfilled 704 in accordance with the characteristics, the characteristics being subsequently determinable using only the sequence number.

Figure 8:
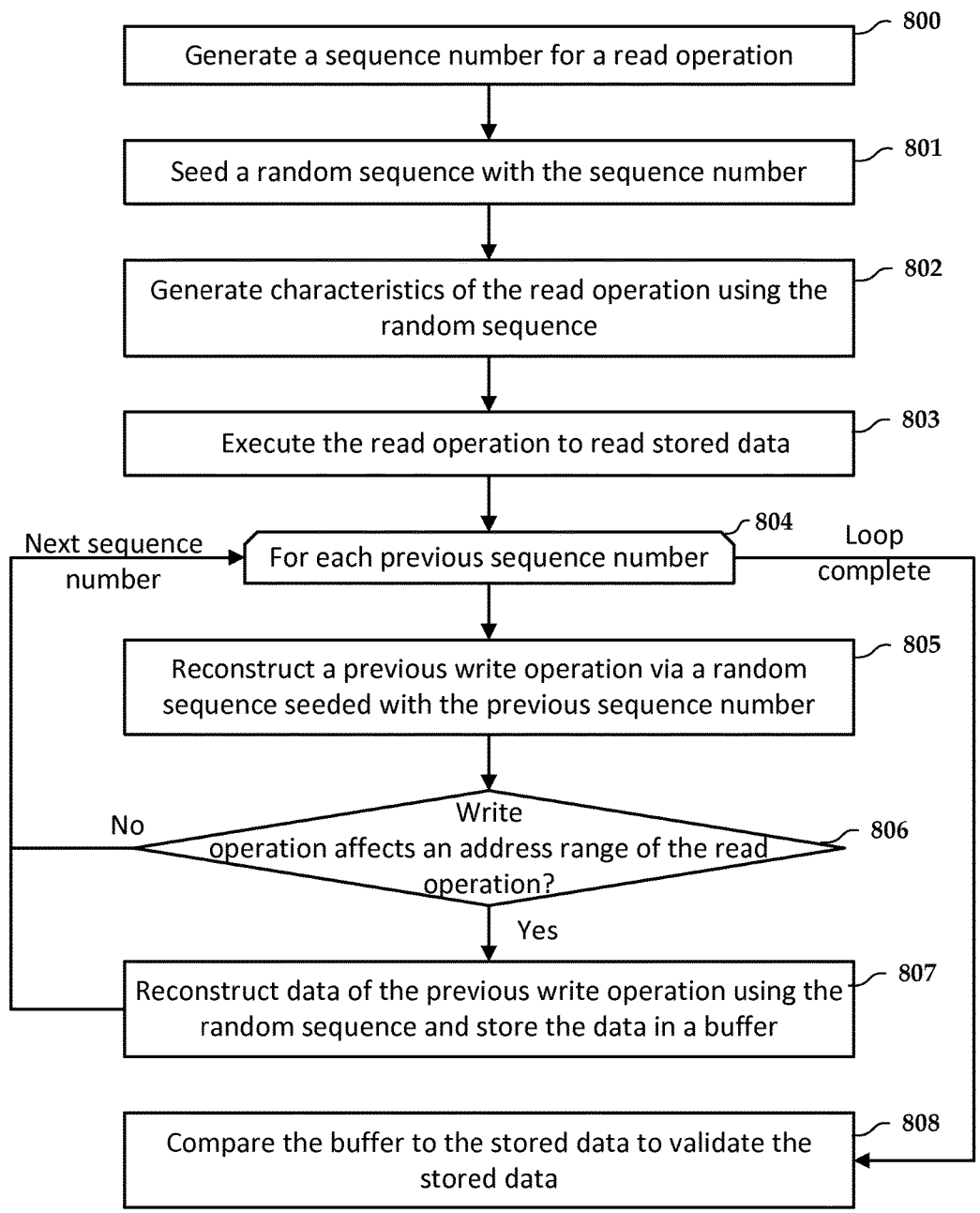

In FIG. 8, a flowchart illustrates a test method according to an example embodiment. The method involves generating 800 a sequence number for a read operation directed to a persistent data storage device. The sequence number may be generated by incrementing a variable that is initialized at a start of the test, e.g., to zero. A first random sequence is seeded 801 with the sequence number, and characteristics of the read operation are generated 802 using the random sequence. The characteristics include an address range of the read operation.

The read operation is executed 803 to read stored data at the address range on the data storage device. Loop limit 804 indicates an iteration through a collection of previous sequence numbers. For each iteration, a previous write operation is reconstructed 805 at least in part via a random sequences seeded with the previous sequence number. If it is determined 806 that the previous write operation wrote data that affected at least part of the address range of the read operation, the data of the write operation is reconstructed 807 from the random sequences and stored in a buffer. After the iteration is complete, the buffer is compared 808 to the stored data to validate at least a portion of the stored data.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method of validation testing of a persistent data storage device, comprising:
    assigning a sequence number to a write operation targeted for the persistent data storage device;
    using the sequence number to seed a random number generator;
    obtaining a random sequence from the random number generator, each element of the random sequence used to generate characteristics of the write operation;
    fulfilling the write operation in accordance with the characteristics; and
    subsequently reconstructing the characteristics using the sequence number and a second random number generator, the reconstructed characteristics being used to validate the write operation.

2. The method of claim 1, wherein the characteristics of the write operation obtained from the random number generator comprising an address range and data written to the address range.

3. The method of claim 2, further comprising:
    generating a read operation using a subsequent sequence number and the random number generator, a second address range of the read operation overlapping the address range of the write operation;
    iterating through a collection of previous sequence numbers that includes the sequence number;
    reconstructing the data of the write operation via the second random number generator based on each previous sequence number;
    executing the read operation to read stored data at the second address range; and
    using the reconstructed data, validating at least a portion of the stored data corresponding to the overlapping between the address range and the second address range.

4. The method of claim 3, wherein the search operations are distributed to different cores of a graphics processing unit.

5. The method of claim 1, wherein generating characteristics of the operation comprises, for at least one of the characteristics, transforming a sample of the random sequence to a desired distribution.

6. The method of claim 1, wherein using the sequence number to seed the random number generator comprises seeding the random number generator with the sequence number plus a constant value that is specific to the validation test.

7. The method of claim 6, wherein the constant value comprises a system time at the start of the test operation.

8. The method of claim 1, wherein validating the write operation uses only the regenerated data and not data from an auxiliary structure stored on a computing apparatus.

9. A method comprising:
    generating a sequence number for a read operation directed to a persistent data storage device;
    generating characteristics of the read operation using a first random sequence that is seeded with the sequence number, the characteristics including an address range of the read operation;
    executing the read operation to read stored data at the address range;
    iterating through a collection of previous sequence numbers and reconstructing previous write operations via random sequences each seeded with the respective previous sequence numbers, the previous write operations having written data that affected at least part of the address range, the data reconstructed from the random sequences and stored in a buffer; and
    comparing the buffer to the stored data to validate at least a portion of the stored data.

10. The method of claim 9, wherein the reconstructing of the previous write operations are reconstructed in parallel via different cores of a graphics processing unit.

11. The method of claim 9, wherein generating characteristics of the read operation and write operations comprises, for at least one of the characteristics, transforming a sample of the random sequence to a desired distribution.

12. The method of claim 9, wherein the read operation and write operations comprise test operations used to validate performance of the persistent data storage device.

13. The method of claim 9, wherein generating characteristics of the read operation comprises generating the first random sequence from a random number generator that is seeded with the sequence number plus a constant value specific to a test run, and wherein reconstructing the previous write operations comprises generating the random sequences from respective random number generators each seeded with the respective previous sequence numbers plus the constant value.

14. The method of claim 13, wherein the constant value comprises a system time at the start of the test run.

15. An apparatus comprising:
    an I/O circuit coupled to a persistent data storage device; and
    a processor configured to execute a test operation comprising:
        generating a sequence number for a read operation directed to the data storage device;

generating characteristics of the read operation using a first random sequence that is seeded with the sequence number, the characteristics including an address range of the read operation;

executing the read operation to read stored data at the address range;

iterating through a collection of previous sequence numbers and reconstructing previous write operations via random sequences each seeded with the respective previous sequence numbers, the previous write operations having written data that affected at least part of the address range, the data reconstructed from the respective random sequences and stored in a buffer; and comparing the buffer to the stored data to validate at least a portion of the stored data.

16. The apparatus of claim 15, wherein the previous write operations are reconstructed in parallel via different cores of a graphics processing unit of the apparatus.

17. The apparatus of claim 15, wherein generating characteristics of the read operation and write operations comprises, for at least one of the characteristics, transforming a sample of the random sequence to a desired distribution.

18. The apparatus of claim 15, wherein generating characteristics of the read operation comprises generating the first random sequence from a random number generator that is seeded with the sequence number plus a constant value specific to a test run, and wherein reconstructing the previous write operations comprises generating the random sequences from respective random number generators each seeded with the respective previous sequence numbers plus the constant value.

19. The apparatus of claim 18, wherein the constant value comprises a system time at the start of the test run.

20. The apparatus of claim 15, wherein the collection of previous sequence numbers is iterated through from newest to oldest, wherein the iteration completes if all elements of the buffer are filled.

* * * * *